(12) United States Patent
Worthington

(10) Patent No.: US 8,084,888 B2
(45) Date of Patent: Dec. 27, 2011

(54) METHOD FOR THE PRODUCTION OF HIGH AMPLITUDE RF VOLTAGES WITH CONTROL OF THE PHASE ANGLE BETWEEN OUTPUTS

(75) Inventor: Kenneth R. Worthington, Cheshire (GB)

(73) Assignee: Micromass UK Limited, Manchester (GB)

( * ) Notice: Subject to any disclaimer, the term of this patent is extended or adjusted under 35 U.S.C. 154(b) by 242 days.

(21) Appl. No.: 12/474,763

(22) Filed: May 29, 2009

(65) Prior Publication Data
US 2010/0301952 A1    Dec. 2, 2010

(51) Int. Cl.
*H02J 1/00* (2006.01)

(52) U.S. Cl. .......................................... 307/87

(58) Field of Classification Search .................... 307/87
See application file for complete search history.

(56) References Cited

U.S. PATENT DOCUMENTS

| 5,573,595 | A  | * | 11/1996 | Dible ..................... 118/723 MP |
| 5,999,077 | A  | * | 12/1999 | Hammond et al. ........... 336/134 |
| 7,602,127 | B2 | * | 10/2009 | Coumou ................ 315/111.21 |

* cited by examiner

*Primary Examiner* — Robert L. Deberadinis
(74) *Attorney, Agent, or Firm* — Jamie H. Rose

(57) ABSTRACT

A method of producing high frequency high amplitude AC voltages with control of the phase angle between outputs from a plurality of generators having individual DC current controlled variable inductors which method comprises controlling the timing of the circuit to allow inputs at the same frequency to have their phase angle preserved. All the outputs are phase locked and synchronized to a common external timed signal and programmed to the same output frequency.

5 Claims, 4 Drawing Sheets

METHOD FOR THE PRODUCTION OF HIGH AMPLITUDE RF VOLTAGES WITH CONTROL OF THE PHASE ANGLE BETWEEN OUTPUTS

This invention relates to a method of producing high frequency high amplitude AC voltages from a plurality of generators having individual DC current controlled variable inductors.

BACKGROUND OF THE INVENTION

It is known that resonant circuits allow for high frequency, high amplitude AC voltages, or RF voltages to be generated without excessive power consumption.

Variable inductors using magnetic saturation are used to achieve high voltage resonance at a particular frequency as disclosed in U.S. Pat. Nos. 5,684,678 and 5,737,203 to Barrett. Electronics control of frequency and phase between a low voltage input signal and a related output signal is known from U.S. Pat. No. 3,046,490 to Marshall et al. Variable inductors, where a saturation field is applied via a single DC control winding, have been applied to power supply circuits as also is known from the Barrett disclosures.

As a general proposition an untuned load causes excessive power dissipation. Manually tuned circuitry may drift, requiring either excessive power or manual intervention. Changing the phase or amplitude on physically adjacent load elements results in the effective load capacitive changing. This in turn causes the resonant frequency to change.

Oscillators which use the resonance between a fixed inductance and the load to determine their frequency will not have controllable phase.

SUMMARY OF THE INVENTION

The inventor has observed that multiple high voltage AC, or RF, generators with individual DC current controlled variable inductors allow the resonance of those circuits to be automatically tuned to the same frequency. By feeding more than one these circuits with the same frequency but at different phases, their outputs will have a controllable phase shift between them.

In mass spectrometry recently developed methods of the analysis of ions requires three or more RF generators that are phase locked in all modes. In particular for one method of separation provided by Micromass/Waters called ScanWave, there is a requirement for variable phase and amplitude but the phases are still locked. It is therefore desirable to provide a method for producing high frequency high amplitude AC voltages from a plurality of generators having individual DC current controlled variable inductors whilst the phase of the RF generated is accurately locked.

One aspect of the present invention provides a method of producing high frequency high amplitude AC voltages with control of the phase angle between outputs from a plurality of generators having individual DC current controlled variable inductors which method comprises controlling the timing of the circuit to allow inputs at the same frequency to have their phase angle preserved According to a feature of this aspect of the invention, all the outputs may be phase locked and synchronised to a common external timed signal and programmed to the same output frequency. Preferably, the phase of each individual generator is programmed independently.

According to another feature of this aspect of the invention a direct digital synthesiser (DDS) may provide an AC reference signal to each generator which reference signal is programmable in both frequency and phase and locked to said common clock and synchronisation signals shared by the other generators. Preferably, the DDS output is amplified and applied to the output transformer primary.

According to a further feature of this aspect of the invention, the output circuit may be matched to the capacitive load of an ion guide and its inductance is controlled by applying a DC saturating field to the timing inductor in order to achieve resonance Preferably, the phase difference between the reference signal and output is compared and a timing error signal is produced, amplified and applied to the DC control winding thereby forming a closed loop automated phase control system.

Another aspect of the invention provides a mass spectrometer incorporating ion guiding means controlled by a method according to any of the four immediately preceding paragraphs.

Yet another aspect of the present invention provides a multiplicity of high voltage AC or RF generators with individual DC current controlled variable inductors to allow the resonance of those circuits to be automatically tuned to the same frequency by feeding more than one of these circuits with the same frequency but at different phases so that their outputs will have a controllable phase shift between them.

A still further aspect of the present invention provides a mass spectrometer incorporating ion guiding means powered by a multiplicity of generators according to the immediately preceding paragraph.

Additional and variable phase delays, due to the power amplifier are compensated for by including the amplifier within the control loop.

If two adjacent cells are set at widely different amplitudes, coupling between the adjacent end plates may cause the lower of the two to be higher than the requested value. This is because, even though the amplifier output is zero, coupling alone from the higher amplitude output is sufficient to exceed the set value. It is possible to cancel some of this coupling by adding a compensating capacitor between the plate and AC phase opposite to that of the adjacent plate.

The variable inductor DC control winding is shielded against residual flux, that has not been removed by magnetic cancellation. The shield can be a conductive metal foil, close to, or surrounding the control winding.

BRIEF DESCRIPTION OF THE DRAWINGS

An embodiment of the present invention will now be described with reference to the accompanying drawings, in which.

DETAILED DESCRIPTION OF THE PREFERRED EMBODIMENT

The frequency control system of the present invention comprises two or more high voltage AC (or RF) generators, each of which resonates with its output load. All the outputs are phase locked and synchronised to a common external clock signal, and programmed to the same output frequency.

However, the phase of each individual generator output may be programmed independently. The operation of each of the generators is identical, as described below.

Figure 1:
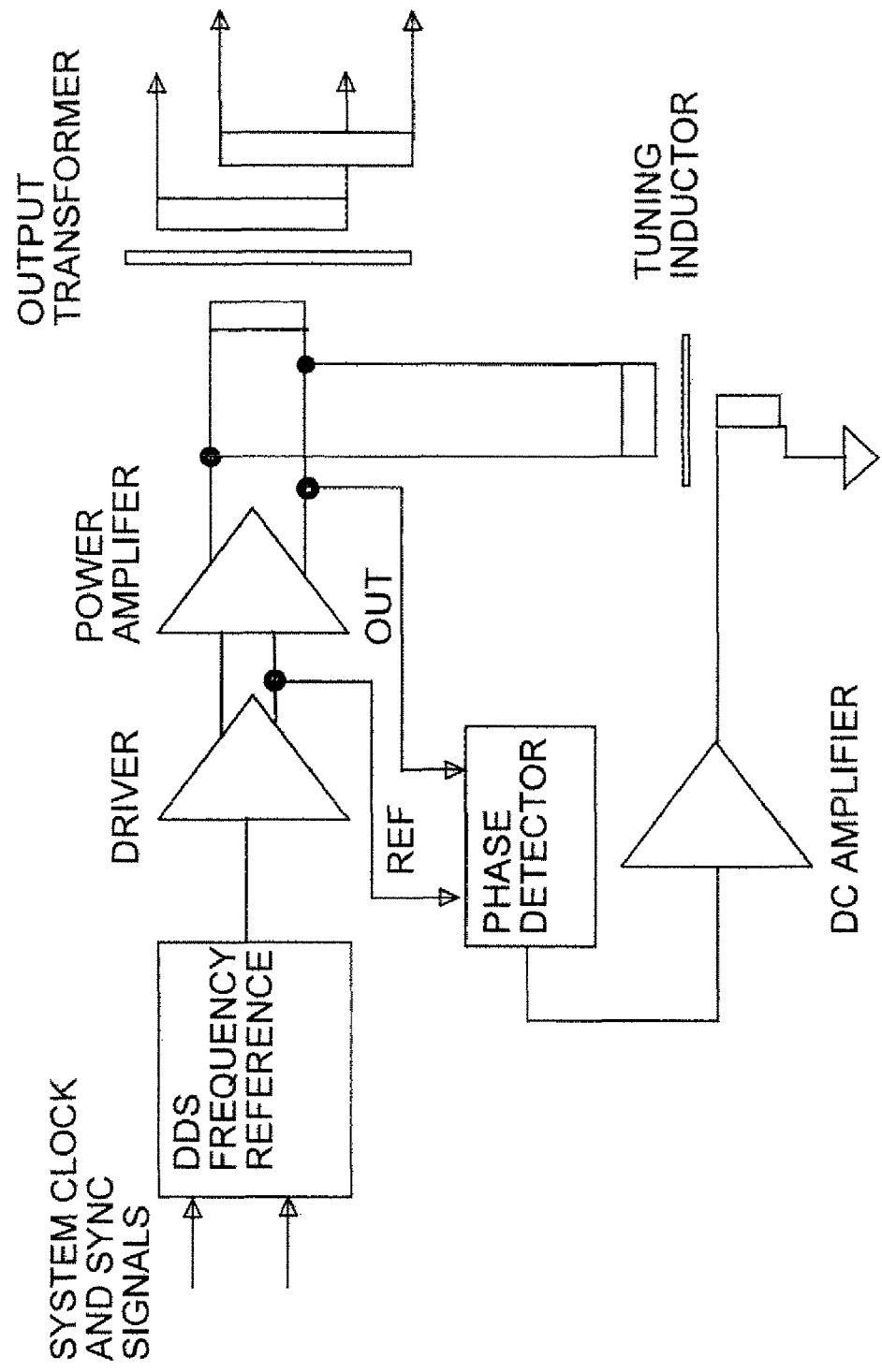
FIG. 1 is a circuit diagram of a frequency control system according to the invention

Referring to FIG. 1, a DDS (Direct Digital Synthesiser), is used to provide an AC reference signal. This is programmable in both frequency and phase, and locked to the common clock and synchronisation signals shared by the other generators.

The DDS output is amplified and applied to the output transformer primary. Since the output circuit must be matched to the capacitive load of the Scan-Wave cell, its inductance must be controlled by applying a DC saturating field to the tuning inductor, in order to achieve resonance.

By comparing the phase difference between the reference signal and output, a tuning error signal is produced. This is amplified and applied to the DC control winding, forming a closed loop automated phase control system. Since the power amplifier is included within this loop, any phase delays due to this are effectively removed.

Resonant operation is most important at high amplitudes, when this is the case the signals available at the phase detector input are relatively high, and correct tuning is easier to achieve. At low amplitudes, the loop is interrupted and the control current held at the last value. Assuming that the load capacitance does not change, this level should be correct when the output returns again to high amplitude.

Since the DDS frequency reference is independent of the output amplitude, the frequency will remain stable at low amplitudes. However, if two adjacent cells are set at widely different amplitudes, coupling between the adjacent end plates may cause the lower of the two to be higher than the requested value. This is because, even though the amplifier output is zero, coupling alone from the higher amplitude output is sufficient to exceed the set value. It is possible to cancel some of this coupling by adding a compensating capacitor to the ion guide (see below).

By repeating this circuitry and having a common frequency source for each DDS, the frequency and/or phase difference between the output windings can be controlled.

Figure 2:
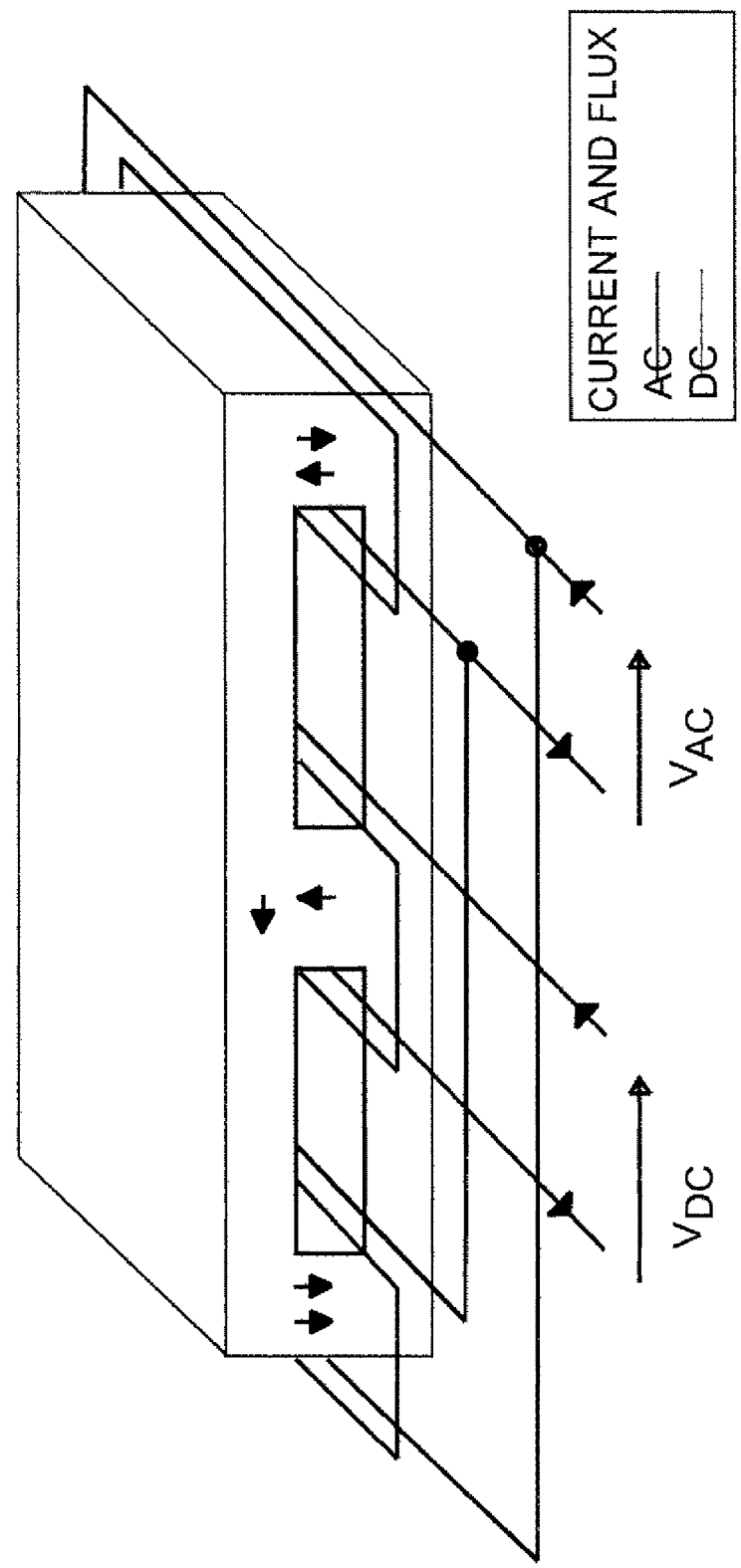
FIG. 2 is a diagram of a tuning inductor winding according to the invention

Referring to FIG. 2, the tuning inductor is arranged with the DC control winding around the centre limb of the core, and the two AC windings around the outer limbs. Both the AC windings are wound in opposite directions, so that the field from these does not pass through the centre limb and does not induce an AC potential in the DC control winding. This is important, as otherwise due to the high turns-ratio, a high voltage would be induced.

The AC windings can be connected in either series or parallel, provided that their magnetic fields are opposite with respect to the DC control winding.

Further protection is obtained by shielding the DC control winding against any residual magnetic flux.

Figure 3:
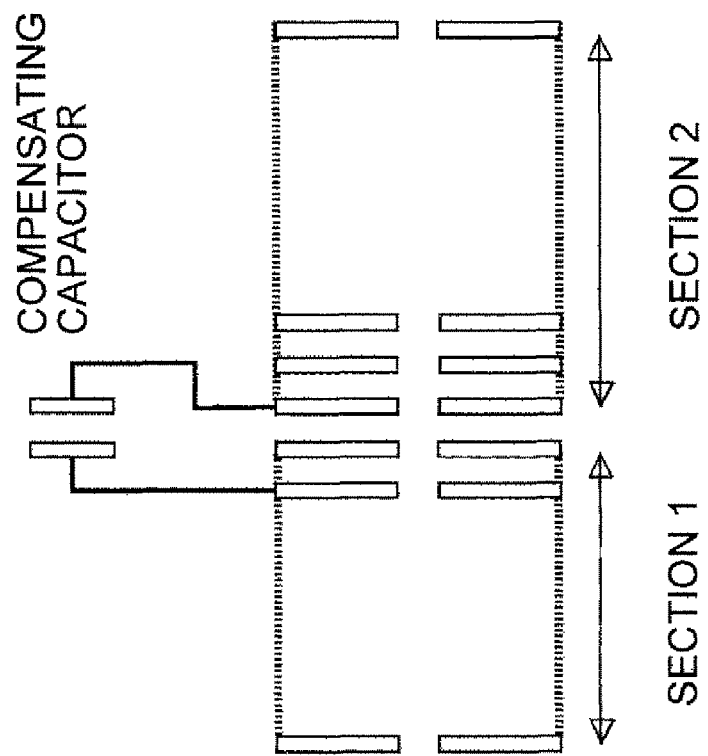
FIG. 3 is a diagram illustrating the positioning of a coupling capacitor according to the invention

Referring now to FIG. 3, where an Ion Guide is divided into sections, there is a stray capacitance between electrodes plates at the boundary between sections. A change in amplitude or phase on one section, causes a disturbance to the adjacent sections, due to this capacitance.

Where both sections are fed from balanced AC outputs, this effect can be minimised by including a compensating capacitor, equal in value to the stray capacitance. The compensating capacitor is connected between the end plate of one section and the opposite AC phase to the adjacent section end plate.

In the particular example shown in FIG. 3, in each section adjacent plates are fed from opposing AC phases. Therefore, the compensating capacitor is connected between, the plate adjacent to the end of section 1 and the end plate of section 2.

Figure 4:
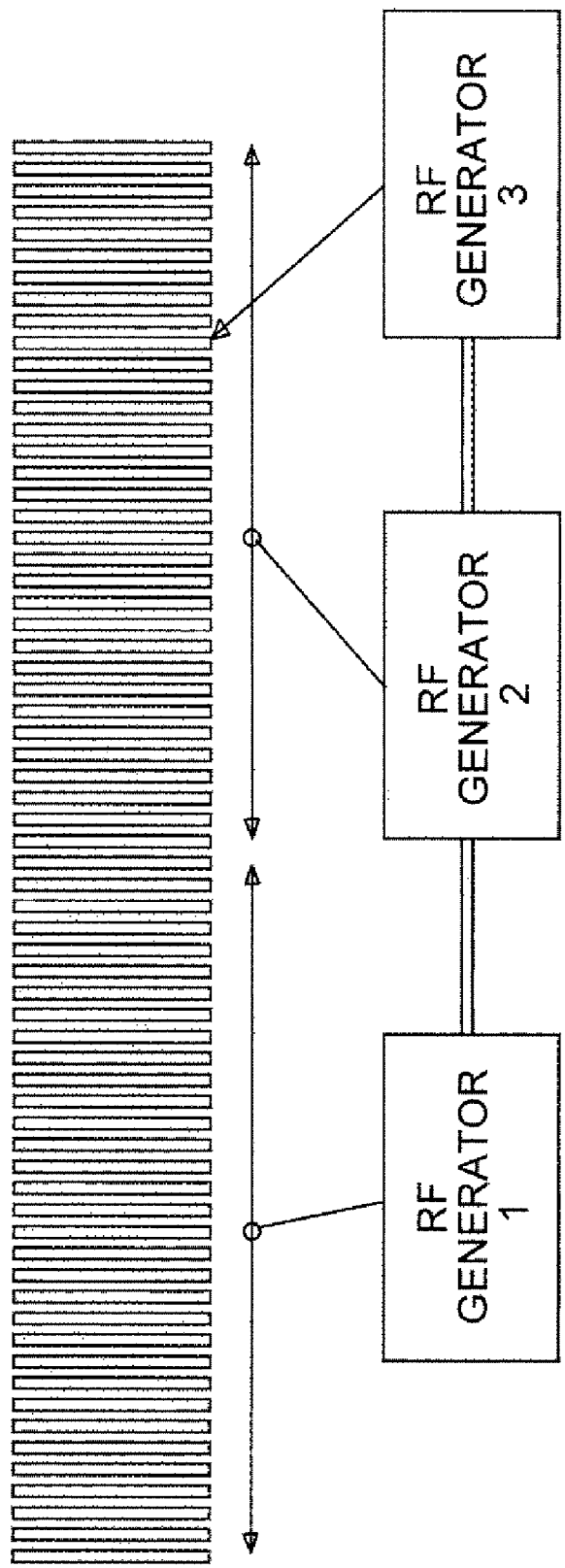
FIG. 4 is an example of the potential use for the invention to power an ion guiding means of a mass spectrometer.

FIG. 4 gives an example of the potential use for the apparatus according to the present invention. In this example, a ScanWave cell may be powered by three generators connected in circuitry as described above

The invention claimed is:

1. A method of high frequency high amplitude AC voltages with control of the phase angle between outputs from a plurality of generators having individual DC current controlled variable inductors, which method comprises controlling the timing of the circuit to allow inputs at the same frequency to have their phase angle preserved, wherein the phase of each individual generator is programmed independently, wherein a direct digital synthesiser (DDS) provides an AC reference signal to each generator which reference signal is programmable in both frequency and phase and locked to said common clock and synchronization signals shared by the other generators, wherein the DDS output is amplified and applied to the output transformer primary.

2. A method according to claim 1 wherein the output circuit is matched to the capacitive load of an ion guide and its inductance is controlled by applying a DC saturating field to the tuning inductor in order to achieve resonance.

3. A method according to claim 2 wherein the phase difference between the reference signal and output is compared and a timing error signal is produced, amplified and applied to the DC control winding thereby forming a closed loop automated phase control system.

4. A mass spectrometer incorporating ion guiding means controlled by a method of producing high frequency high amplitude AC voltages with control of the phase angle between outputs from a plurality of generators having individual DC current controlled variable inductors, which method comprises controlling the timing of the circuit to allow inputs at the same frequency to have their phase angle preserved.

5. A mass spectrometer incorporating ion guiding means powered by a multiplicity of high voltage AC or RF generators with individual DC current controlled variable inductors to allow the resonance of those circuits to be automatically tuned to the same frequency by feeding more than one of these circuits with the same frequency but at different phases so that their outputs will have a controllable phase shift between them.

* * * * *